(12) United States Patent
Shin

(10) Patent No.: US 7,928,643 B2
(45) Date of Patent: Apr. 19, 2011

(54) PLASMA DISPLAY APPARATUS INCORPORATING COMBINED HEATPROOF AND VIBRATION DAMPING SHEET ATTACHED TO DRIVING CIRCUIT SUBSTRATE

(75) Inventor: Woon Seo Shin, Gunpo-si (KR)

(73) Assignee: LG Electronics Inc., Seoul (KR)

( * ) Notice: Subject to any disclaimer, the term of this patent is extended or adjusted under 35 U.S.C. 154(b) by 1517 days.

(21) Appl. No.: 11/275,310

(22) Filed: Dec. 22, 2005

(65) Prior Publication Data

US 2006/0139303 A1 Jun. 29, 2006

(30) Foreign Application Priority Data

Dec. 24, 2004 (KR) .................. 10-2004-0112475

(51) Int. Cl.
*H01J 17/49* (2006.01)
(52) U.S. Cl. ............ 313/269; 313/44; 313/46; 313/582; 361/704; 361/679.21; 361/679.46
(58) Field of Classification Search .......... 313/582–587, 313/269, 46, 44; 361/679.21, 679.46, 679.54, 361/704

See application file for complete search history.

(56) References Cited

U.S. PATENT DOCUMENTS 7,505,270 B2 * 3/2009 Kim .............................. 361/704
2004/0119410 A1 * 6/2004 Jun et al. ....................... 313/582
2005/0068738 A1 * 3/2005 Kim et al. ..................... 361/704
2006/0028137 A1 * 2/2006 Kim et al. ..................... 313/582
2006/0061968 A1 * 3/2006 Woo et al. ..................... 361/704
2007/0228918 A1 * 10/2007 Kang ............................ 313/582

FOREIGN PATENT DOCUMENTS

| CN | 1174395 A | 2/1998 |
| CN | 1220727 A | 6/1999 |
| JP | 10-040823 | 2/1998 |
| JP | 10-254372 | 9/1998 |
| JP | 11073140 A * | 3/1999 |
| JP | 2003-029647 | 1/2003 |
| JP | 2004-038173 | 2/2004 |
| KR | 10-2006-0053392 | 5/2006 |

OTHER PUBLICATIONS

Chinese Office Action dated Mar. 21, 2008, on Chinese Application No. 2005101362829, (11 pages) with full English translation.

* cited by examiner

*Primary Examiner* — Mariceli Santiago
(74) *Attorney, Agent, or Firm* — Fish & Richardson P.C.

(57) ABSTRACT

This document invention relates to a display apparatus, and more particularly, to a plasma display apparatus. The plasma display apparatus according to an embodiment of the present invention comprises a plasma display panel in which upper and lower substrates are combined, a vibration damping sheet formed on a rear surface of the plasma display panel, and a plurality of driving circuit substrates formed on a rear surface of the vibration damping sheet, for driving the plasma display panel. According to an embodiment of the present invention, noise occurring in a discharge of a plasma display panel and driving circuit elements is precluded. Therefore, a high level of noise reduction can guaranteed and the manufacturing cost of a plasma display apparatus can be saved.

13 Claims, 9 Drawing Sheets

PLASMA DISPLAY APPARATUS INCORPORATING COMBINED HEATPROOF AND VIBRATION DAMPING SHEET ATTACHED TO DRIVING CIRCUIT SUBSTRATE

This Nonprovisional application claims priority under 35 U.S.C. § 119(a) on Patent Application No. 10-2004-0112475 filed in Korea on Dec. 24, 2004 the entire contents of which are hereby incorporated by reference.

BACKGROUND OF THE INVENTION

1. Field of the Invention

This document relates to a display apparatus, and more particularly, to a plasma display apparatus.

2. Description of the Background Art

In general, a plasma display apparatus of a display apparatus comprises a plasma display panel and a driver for driving the plasma display panel.

In general, in a plasma display panel, a barrier rib formed between a front substrate and a rear substrate forms one unit cell. Each cell is filled with an inert gas containing a primary discharge gas, such as neon (Ne), helium (He) or a mixed gas of Ne+He, and a small amount of xenon (Xe). If the inert gas is discharged with a high frequency voltage, vacuum ultraviolet rays are generated. Phosphors formed between the barrier ribs are excited to implement images. The plasma display panel can be made thin, and has thus been in the spotlight as the next-generation display devices.

FIG. 1 is a perspective view illustrating the construction of a general plasma display panel. As shown in FIG. 1, the plasma display panel comprises a front substrate 100 and a rear substrate 110. In the front substrate 100, a plurality of sustain electrode pairs in which scan electrodes 102 and sustain electrodes 103 are formed in pairs is arranged on a front glass 101 serving as a display surface on which images are displayed. In the rear substrate 110, a plurality of address electrodes 113 crossing the plurality of sustain electrode pairs is arranged on a rear glass 111 serving as a rear surface. At this time, the front substrate 100 and the rear substrate 110 are parallel to each other with a predetermined distance therebetween.

The front substrate 100 comprises the pairs of scan electrodes 102 and sustain electrodes 103, which mutually discharge one another and maintain the emission of a cell within one discharge cell. In other words, each of the scan electrode 102 and the sustain electrode 103 has a transparent electrode "a" formed of a transparent ITO material and a bus electrode "b" formed of a metal material. The scan electrodes 102 and the sustain electrodes 103 are covered with one or more dielectric layers 104 for limiting a discharge current and providing insulation among the electrode pairs. A protection layer 105 having Magnesium Oxide (MgO) deposited thereon is formed on the dielectric layers 104 so as to facilitate discharge conditions.

In the rear substrate 110, barrier ribs 112 of stripe form (or well form), for forming a plurality of discharge spaces, i.e., discharge cells are arranged parallel to one another. Furthermore, a plurality of address electrodes 113, which generate vacuum ultraviolet rays by performing an address discharge, are disposed parallel to the barrier ribs 112. R, G and B phosphor layers 114 that radiate a visible ray for displaying images during an address discharge are coated on a top surface of the rear substrate 110. A dielectric layer 115 for protecting the address electrodes 113 is formed between the address electrodes 113 and the phosphor layers 114.

FIG. 2 shows the structure of a plasma display apparatus adopting the plasma display panel of FIG. 1 in the related art.

As shown in FIG. 2, the related art plasma display apparatus comprises a casing 210 having a front cabinet 211 and a back cover 212 that form an external form, a plasma display panel 220 disposed within the casing 210, for implementing images by exciting phosphors with vacuum ultraviolet rays generated by a gas discharge, a plurality of driving circuit substrate 230 for driving and controlling the plasma display panel 220, a frame 240, which is connected to the plurality of driving circuit substrate 230 and has a heat dissipation function of dissipating heat generated when the plasma display apparatus is driven, a filter 250 formed at the front of the plasma display panel 220, a finger spring gasket 260 and a filter supporter 270 that support the filter 250 and electrically connect the filter 250 to the metal back cover 212, and a module supporter 280 that supports the plasma display panel 220 comprising the plurality of driving circuit substrate 230.

In the related art plasma display apparatus constructed above, when a discharge is generated in discharge cells within the plasma display panel 220, heat and noise are essentially generated.

Heat and noise are also inevitably generated from various elements attached on the plurality of driving circuit substrate 230 for forming a potential within the discharge cells for the purpose of a discharge of the plasma display panel 220.

As described above, heat and noise generated from the discharge cells within the plasma display panel 220 and various elements attached on the plurality of driving circuit substrate 230 are major factors that degrade the quality of the plasma display apparatus.

More particularly, recently, a noise problem of the plasma display apparatus surfaces as an important issue. It is very difficult to fundamentally solve the noise problem.

The reason will now be described with reference to various elements attached on the plasma display panel 220 and the plurality of driving circuit substrate 230.

The plasma display panel 220 is completed through lost of manufacturing processes. Therefore, if any one process is performed in order to reduce noise, it has an affect on lots of subsequent processes. This requires a lot of manpower and expenses. This is a big loss from an economic point of view.

Furthermore, to solve the problem on case-by-case basis by analyzing the cause of noise into lots of various elements attached on the plurality of driving circuit substrate 230 also requires a great amount of manpower and cost. This results in a significant loss in terms of economy.

SUMMARY OF THE INVENTION

Accordingly, an object of an embodiment of the present invention is to solve at least the problems and disadvantages of the background art.

It is an object of an embodiment of the present invention to preclude noise occurring in a discharge of a plasma display panel and driving circuit elements with low cost.

It is another object of an embodiment of the present invention to improve a heatproof effect by adding a thermal conductive material to a vibration damping sheet.

A plasma display apparatus according to an embodiment of the present invention comprises a plasma display panel in which upper and lower substrates are combined, a vibration damping sheet formed on a rear surface of the plasma display panel, and a plurality of driving circuit substrates formed on a rear surface of the vibration damping sheet, for driving the plasma display panel.

A plasma display apparatus according to another embodiment of the present invention comprises a plasma display panel in which upper and lower substrates are combined, a heatproof sheet formed on a rear surface of the plasma display panel, a vibration damping sheet formed on a rear surface of the heatproof sheet, and a plurality of driving circuit substrates formed on a rear surface of the vibration damping sheet, for driving the plasma display panel.

A plasma display apparatus according to still another embodiment of the present invention comprises a plasma display panel in which upper and lower substrates are combined, a vibration damping sheet formed on a rear surface of the plasma display panel, a heatproof sheet formed on a rear surface of the vibration damping sheet, and a plurality of driving circuit substrates formed on a rear surface of the heatproof sheet, for driving the plasma display panel.

According to the present invention, noise occurring in a discharge of a plasma display panel and driving circuit elements is precluded. Therefore, the present invention is advantageous in that it can guarantee a high level of noise reduction and can save the manufacturing cost of a plasma display apparatus.

BRIEF DESCRIPTION OF THE DRAWINGS

The embodiment of the invention will be described in detail with reference to the following drawings in which like numerals refer to like elements.

DETAILED DESCRIPTION OF PREFERRED EMBODIMENTS

Figure 1:
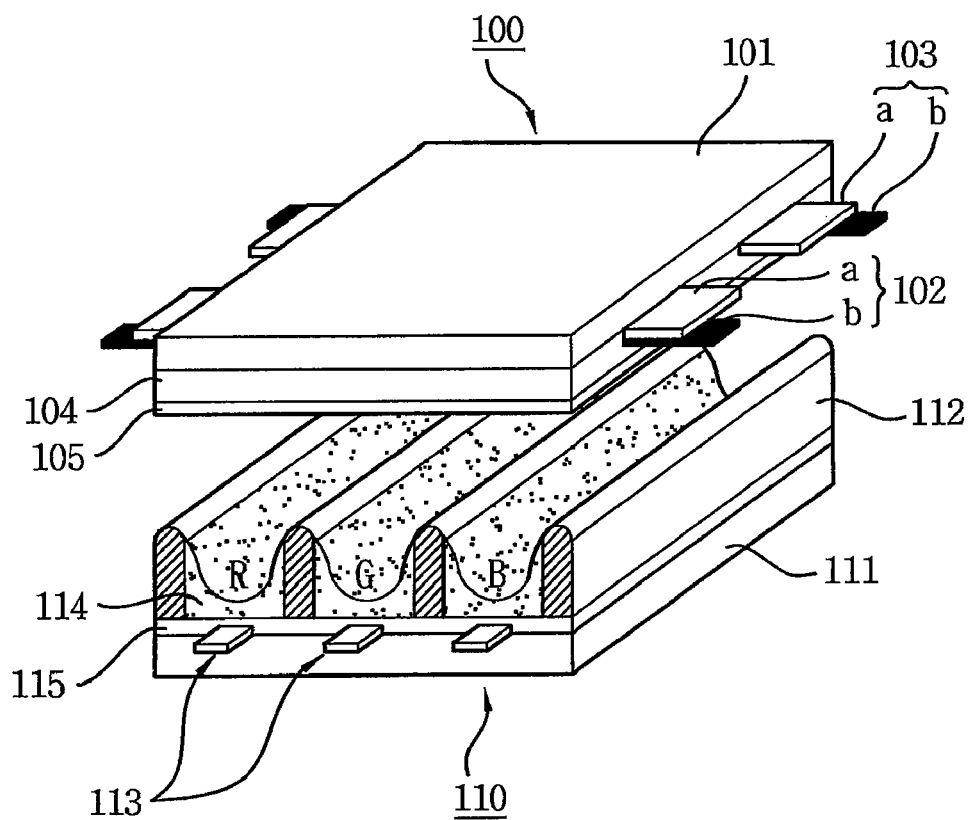
FIG. 1 is a perspective view illustrating the structure of a general plasma display panel.
Figure 2:
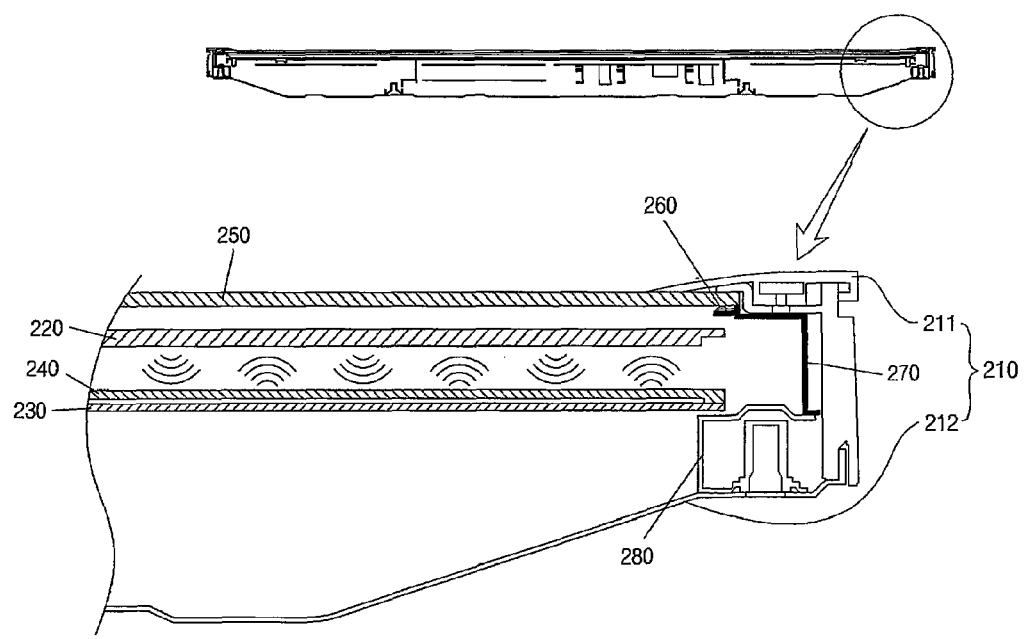
FIG. 2 shows the structure of a plasma display apparatus adopting the plasma display panel of FIG. 1 in the related art.

Embodiments of the present invention will be described in a more detailed manner with reference to the drawings.

A plasma display apparatus according to an embodiment of the present invention comprises a plasma display panel in which upper and lower substrates are combined, a vibration damping sheet formed on a rear surface of the plasma display panel, and a plurality of driving circuit substrates formed on a rear surface of the vibration damping sheet, for driving the plasma display panel.

The plasma display apparatus further comprises a frame formed on the rear surface of the vibration damping sheet, for fixing the plurality of driving circuit substrates.

The vibration damping sheet comprises at least one of a polymer-based material and a fiber type inorganic material.

The vibration damping sheet comprises a thermal conductive material.

The thermal conductive material is carbon (C).

A plasma display apparatus according to another embodiment of the present invention comprises a plasma display panel in which upper and lower substrates are combined, a heatproof sheet formed on a rear surface of the plasma display panel, a vibration damping sheet formed on a rear surface of the heatproof sheet, and a plurality of driving circuit substrates formed on a rear surface of the vibration damping sheet, for driving the plasma display panel.

The plasma display apparatus further comprises a frame formed on the rear surface of the vibration damping sheet, for fixing the plurality of driving circuit substrates.

The vibration damping sheet is attached opposite to at least one or more of the plurality of driving circuit substrates.

The vibration damping sheet comprises at least one of a polymer-based material and a fiber type inorganic material.

The vibration damping sheet comprises a thermal conductive material, and the thermal conductive material is carbon (C).

A groove is formed in a rear surface of the heatproof sheet, and the vibration damping sheet is formed in the groove.

The vibration damping sheet comprises at least one of a polymer-based material and a fiber type inorganic material.

The vibration damping sheet comprises a thermal conductive material, and the thermal conductive material is carbon (C).

A plasma display apparatus according to still another embodiment of the present invention comprises a plasma display panel in which upper and lower substrates are combined, a vibration damping sheet formed on a rear surface of the plasma display panel, a heatproof sheet formed on a rear surface of the vibration damping sheet, and a plurality of driving circuit substrates formed on a rear surface of the heatproof sheet, for driving the plasma display panel.

The plasma display apparatus further comprises a frame formed on the rear surface of the heatproof sheet, for fixing the plurality of driving circuit substrates.

The vibration damping sheet is attached opposite to at least one or more of the plurality of driving circuit substrates.

The vibration damping sheet comprises at least one of a polymer-based material and a fiber type inorganic material.

The vibration damping sheet comprises a thermal conductive material, and the thermal conductive material is carbon (C).

A groove is formed in a front surface of the heatproof sheet, and the vibration damping sheet is formed in the groove.

The vibration damping sheet comprises at least one of a polymer-based material and a fiber type inorganic material, the vibration damping sheet comprises a thermal conductive material, and the thermal conductive material is carbon (C).

Detailed embodiments of the present invention will now be described in connection with reference to the accompanying drawings.

Figure 3:
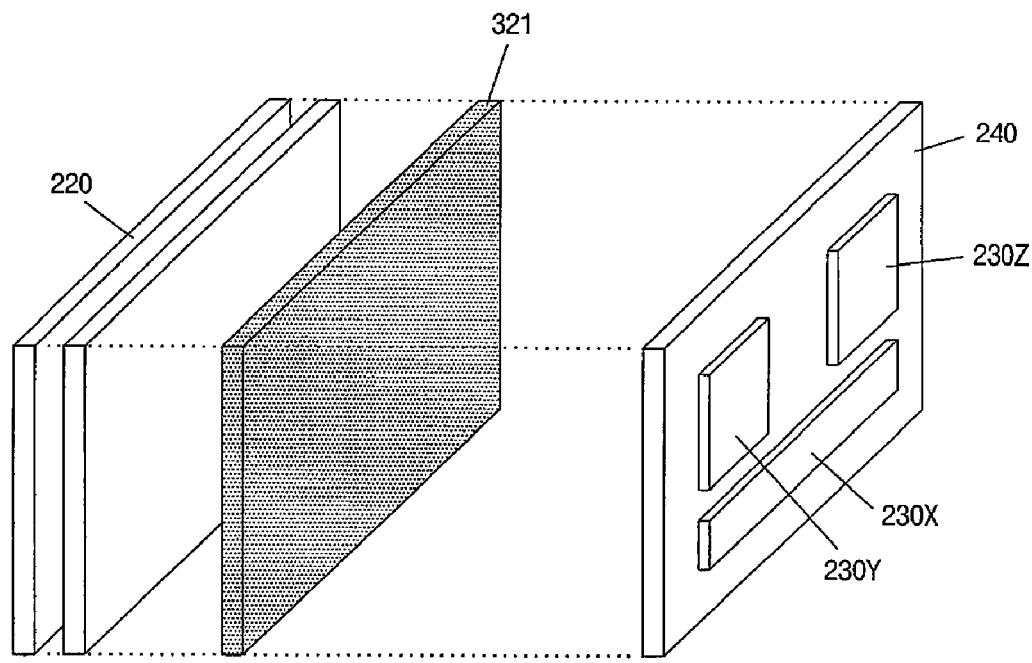
FIG. 3 is a dismantled perspective view illustrating the structure of a plasma display apparatus according to a first embodiment of the present invention.

FIG. 3 is a dismantled perspective view illustrating the structure of a plasma display apparatus according to a first embodiment of the present invention.

As shown in FIG. 3, the plasma display apparatus according to a first embodiment of the present invention comprises a plasma display panel 220 in which an upper and lower substrates are combined and on which images are displayed by a gas discharge, a vibration damping sheet 321 formed on a rear surface of the plasma display panel 220, for precluding noise occurring from discharge cells within the plasma display panel 220 and driving circuit elements when the plasma display panel 220 is driving for a discharge, a frame 240 formed on a rear surface of the vibration damping sheet 321, for fixing a plurality of driving circuit substrates that drive the plasma display panel 220, and a plurality of driving circuit substrates 230X, 230Y and 230Z fixed to a rear surface of the frame 240, for driving the plasma display panel 220.

The plasma display apparatus constructed above inevitably generates heat and noise when a discharge is generated in the discharge cells within the plasma display panel 220. Heat and noise are also inevitably generated even in various elements attached on the plurality of driving circuit substrates 230X, 230Y and 230Z for forming a potential within the discharge cells for the purpose of a discharge of the plasma display panel 220.

As described above, heat and noise radiated from the discharge cells within the plasma display panel 220 and various elements attached on the plurality of driving circuit substrates 230X, 230Y and 230Z are major factors that degrade the quality of the plasma display apparatus.

In the present invention, to prevent such noise from radiating outside the plasma display apparatus, the vibration damping sheet 321 is disposed between the plasma display panel 220 and the frame 240 in which the plurality of driving circuit substrates 230X, 230Y and 230Z are mounted, as shown in FIG. 3.

If the vibration damping sheet 321 is attached so that it is brought in contact with the plasma display panel 220 and the frame 240 in which the plurality of driving circuit substrates 230X, 230Y and 230Z are mounted as described above, the transfer of vibration occurring when the plasma display panel 220 is discharged and vibration occurring when a voltage is applied to the driving elements in order to drive the plasma display panel 220 can be prevented. It is thus possible to preclude noise from radiating to the outside.

At this time, the vibration damping sheet 321 can preferably comprise at least one of a polymer-based material and a fiber type inorganic material. More preferably, if the vibration damping sheet 321 comprises both the polymer-based material and the fiber type inorganic material, the transfer of vibration, which is a main cause of noise, can be precluded using frication between polymer and fiber. Therefore, noise can be attenuated within the vibration damping sheet 321 and then disappear.

Furthermore, the vibration damping sheet 321 can preferably comprise a thermal conductive material. More preferably, the thermal conductive material can be formed of carbon (C). Therefore, the thermal conductive material performs a heat dissipation function along with a heatproof sheet 322, so that the heat dissipation function of the plasma display apparatus can be doubled.

Figure 4:
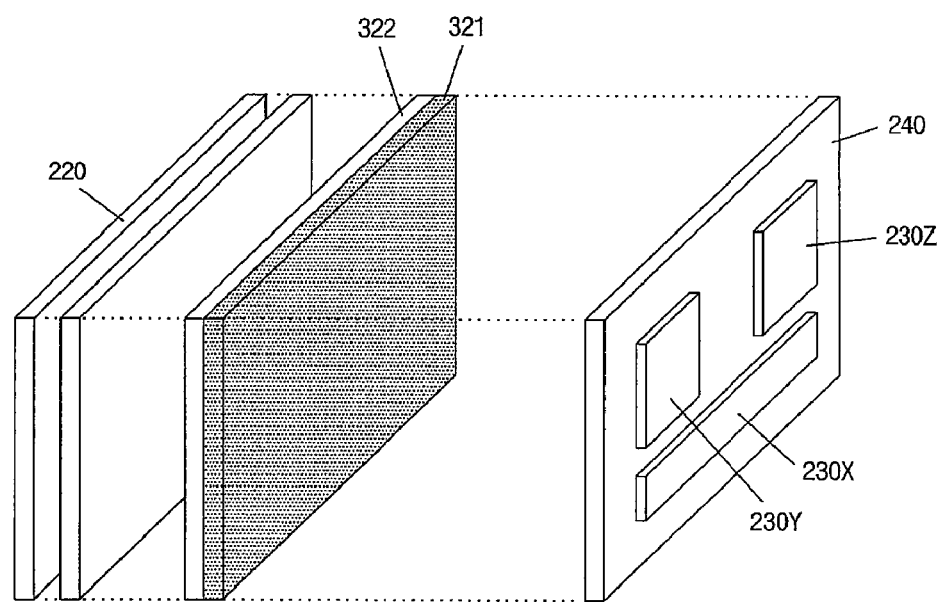
FIG. 4 is a dismantled perspective view illustrating the structure of a plasma display apparatus according to a second embodiment of the present invention.

FIG. 4 is a dismantled perspective view illustrating the structure of a plasma display apparatus according to a second embodiment of the present invention.

As shown in FIG. 4, the plasma display apparatus according to a second embodiment of the present invention comprises a plasma display panel 220 in which an upper and lower substrates are combined and on which images are displayed by a gas discharge, a heatproof sheet 322 formed on a rear surface of the plasma display panel 220, for precluding heat generating from discharge cells within the plasma display panel 220 and driving circuit elements when the plasma display panel 220 is driving for a discharge, a vibration damping sheet 321 formed on a rear surface of the plasma display panel 220, for precluding noise occurring from discharge cells within the plasma display panel 220 and driving circuit elements when the plasma display panel 220 is driving for a discharge, a frame 240 formed on a rear surface of the vibration damping sheet 321, for fixing a plurality of driving circuit substrates 230X, 230Y and 230Z that drive the plasma display panel 220, and the plurality of driving circuit substrates 230X, 230Y and 230Z fixed to a rear surface of the frame 240, for driving the plasma display panel 220.

The plasma display apparatus constructed above inevitably generates heat and noise when a discharge is generated in the discharge cells within the plasma display panel 220. Heat and noise are also inevitably generated even in various elements attached on the plurality of driving circuit substrates 230X, 230Y and 230Z for forming a potential within the discharge cells for the purpose of a discharge of the plasma display panel 220.

As described above, heat and noise radiated from the discharge cells within the plasma display panel 220 and various elements attached on the plurality of driving circuit substrates 230X, 230Y and 230Z are major factors that degrade the quality of the plasma display apparatus.

In the present invention, to prevent such noise from radiating outside the plasma display apparatus, the vibration damping sheet 321 is disposed between the heatproof sheet 322 and the frame 240 in which the plurality of driving circuit substrates 230X, 230Y and 230Z are mounted, as shown in FIG. 4.

If the vibration damping sheet 321 is attached so that it is brought in contact with the heatproof sheet 322 and the frame 240 in which the plurality of driving circuit substrates 230X, 230Y and 230Z are mounted as described above, the transfer of vibration occurring when the plasma display panel 220 is discharged and vibration occurring when a voltage is applied to the driving elements in order to drive the plasma display panel 220 can be prevented. It is thus possible to preclude noise from radiating to the outside.

At this time, the vibration damping sheet 321 can preferably comprise at least one of a polymer-based material and a fiber type inorganic material. More preferably, if the vibration damping sheet 321 comprises both the polymer-based material and the fiber type inorganic material, the transfer of vibration, which is a main cause of noise, can be precluded using frication between polymer and fiber. Therefore, noise can be attenuated within the vibration damping sheet 321 and then disappear.

Furthermore, the vibration damping sheet 321 can preferably comprise a thermal conductive material. More preferably, the thermal conductive material can be formed of carbon (C). Therefore, the thermal conductive material performs a heat dissipation function along with a heatproof sheet 322, so that the heat dissipation function of the plasma display apparatus can be doubled.

Figure 5:
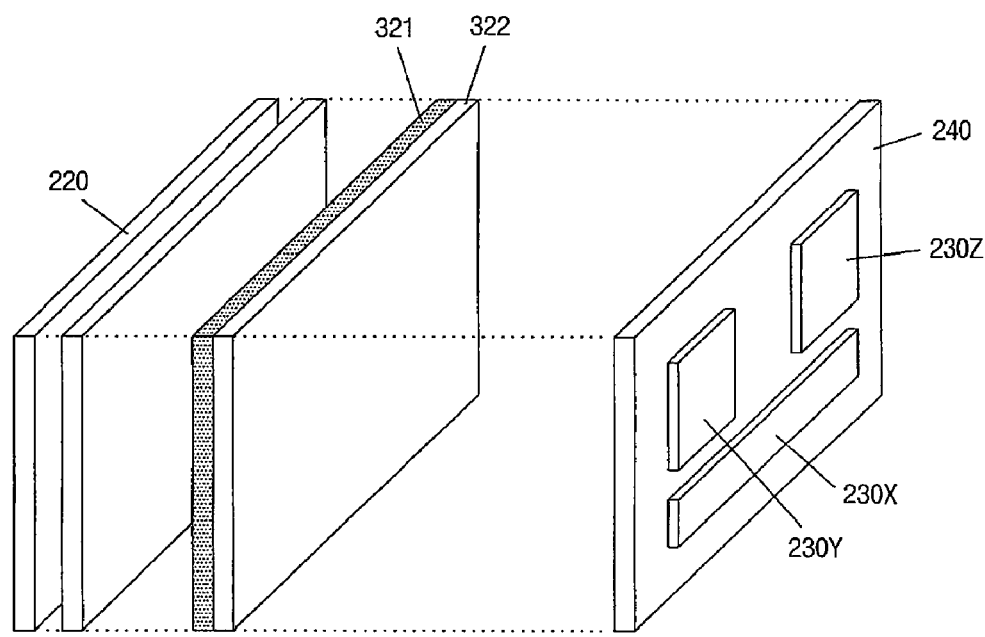
FIG. 5 is a dismantled perspective view illustrating the structure of a plasma display apparatus according to a third embodiment of the present invention.

FIG. 5 is a dismantled perspective view illustrating the structure of a plasma display apparatus according to a third embodiment of the present invention.

As shown in FIG. 5, the plasma display apparatus according to a third embodiment of the present invention comprises a plasma display panel 220 in which an upper and lower substrates are combined and on which images are displayed by a gas discharge, a vibration damping sheet 321 formed on a rear surface of the plasma display panel 220, for precluding noise occurring from discharge cells within the plasma display panel 220 and driving circuit elements when the plasma display panel 220 is driving for a discharge, a heatproof sheet 322 formed on a rear surface of the vibration damping sheet 321, for precluding heat generating from discharge cells within the plasma display panel 220 and driving circuit elements when the plasma display panel 220 is driving for a discharge, a frame 240 formed on a rear surface of the heatproof sheet 322, for fixing a plurality of driving circuit substrates 230X, 230Y and 230Z that drive the plasma display panel 220, and the plurality of driving circuit substrates 230X, 230Y and 230Z fixed to a rear surface of the frame 240, for driving the plasma display panel 220.

The plasma display apparatus constructed above inevitably generates heat and noise when a discharge is generated in the discharge cells within the plasma display panel 220. Heat and noise are also inevitably generated even in various elements attached on the plurality of driving circuit substrates 230X, 230Y and 230Z for forming a potential within the discharge cells for the purpose of a discharge of the plasma display panel 220.

As described above, heat and noise radiated from the discharge cells within the plasma display panel 220 and various elements attached on the plurality of driving circuit substrates 230X, 230Y and 230Z are major factors that degrade the quality of the plasma display apparatus.

In the present invention, to prevent such noise from radiating outside the plasma display apparatus, the vibration damping sheet 321 is disposed between the plasma display panel 220 and the heatproof sheet 322, as shown in FIG. 5.

If the vibration damping sheet 321 is attached so that it is brought in contact with the plasma display panel 220 and the heatproof sheet 322 as described above, the transfer of vibration occurring when the plasma display panel 220 is discharged and vibration occurring when a voltage is applied to the driving elements in order to drive the plasma display panel 220 can be prevented. It is thus possible to preclude noise from radiating to the outside.

At this time, the vibration damping sheet 321 can preferably comprise at least one of a polymer-based material and a fiber type inorganic material. More preferably, if the vibration damping sheet 321 comprises both the polymer-based material and the fiber type inorganic material, the transfer of vibration, which is a main cause of noise, can be precluded using frication between polymer and fiber. Therefore, noise can be attenuated within the vibration damping sheet 321 and then disappear.

Furthermore, the vibration damping sheet 321 can preferably comprise a thermal conductive material. More preferably, the thermal conductive material can be formed of carbon (C). Therefore, the thermal conductive material performs a heat dissipation function along with a heatproof sheet 322, so that the heat dissipation function of the plasma display apparatus can be doubled.

Figure 6:
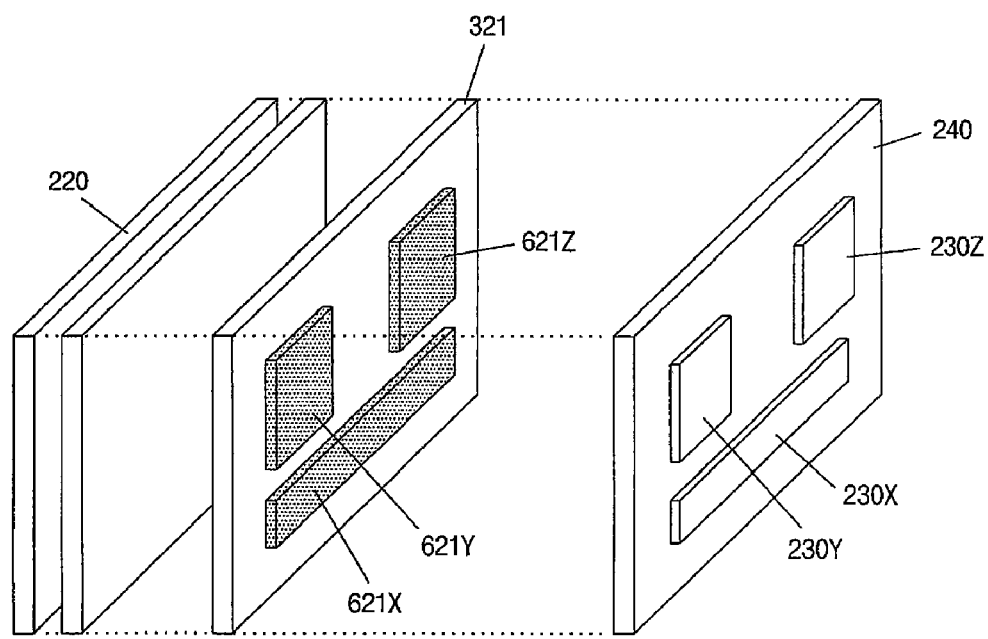
FIG. 6 is a dismantled perspective view illustrating the structure of a plasma display apparatus according to a fourth embodiment of the present invention.

FIG. 6 is a dismantled perspective view illustrating the structure of a plasma display apparatus according to a fourth embodiment of the present invention.

As shown in FIG. 6, the plasma display apparatus according to a fourth embodiment of the present invention comprises a plasma display panel 220 in which an upper and lower substrates are combined and on which images are displayed by a gas discharge, a heatproof sheet 322 formed on a rear surface of the plasma display panel 220, for precluding heat generating from discharge cells within the plasma display panel 220 and driving circuit elements when the plasma display panel 220 is driving for a discharge, a vibration damping sheet 621X, 621Y and 621Z formed on a rear surface of the heatproof sheet 322 in such a way to be opposite to at least one or more of a plurality of driving circuit substrates 230X, 230Y and 230Z, for precluding noise generating from the discharge cells within the plasma display panel 220 and the plurality of driving circuit elements when the plasma display panel 220 is driving for a discharge, a frame 240 formed on a rear surface of the heatproof sheet 322, for fixing a plurality of driving circuit substrates 230X, 230Y and 230Z that drive the plasma display panel 220, and the plurality of driving circuit substrates 230X, 230Y and 230Z fixed to a rear surface of the frame 240, for driving the plasma display panel 220.

The plasma display apparatus constructed above inevitably generates heat and noise when a discharge is generated in the discharge cells within the plasma display panel 220. Heat and noise are also inevitably generated even in various elements attached on the plurality of driving circuit substrates 230X, 230Y and 230Z for forming a potential within the discharge cells for the purpose of a discharge of the plasma display panel 220.

As described above, heat and noise radiated from the discharge cells within the plasma display panel 220 and various elements attached on the plurality of driving circuit substrates 230X, 230Y and 230Z are major factors that degrade the quality of the plasma display apparatus.

In the present invention, to prevent such noise from radiating outside the plasma display apparatus, the vibration damping sheet 621X, 621Y and 621Z are formed to be opposite to at least one or more of the plurality of driving circuit substrates 230X, 230Y and 230Z between the heatproof sheet 322 and the frame 240 in which the plurality of driving circuit substrates 230X, 230Y and 230Z are mounted, as shown in FIG. 6.

If the vibration damping sheet 621X, 621Y and 621Z are attached so that they are brought in contact with the plasma display panel 220 and the heatproof sheet 322 as described above, the transfer of vibration occurring when the plasma display panel 220 is discharged and vibration occurring when a voltage is applied to the driving elements in order to drive the plasma display panel 220 can be prevented. It is thus possible to preclude noise from radiating to the outside.

At this time, the vibration damping sheet 621X, 621Y and 621Z can preferably comprise at least one of a polymer-based material and a fiber type inorganic material. More preferably, if the vibration damping sheet 621X, 621Y and 621Z comprises both the polymer-based material and the fiber type inorganic material, the transfer of vibration, which is a main cause of noise, can be precluded through frication between polymer and fiber. Therefore, noise can be attenuated within the vibration damping sheet 621X, 621Y and 621Z and then disappear.

Furthermore, the vibration damping sheet 621X, 621Y and 621Z can preferably comprise a thermal conductive material. More preferably, the thermal conductive material can be formed of carbon (C). Therefore, the thermal conductive material performs a heat dissipation function along with a heatproof sheet 322, so that the heat dissipation function of the plasma display apparatus can be doubled.

Figure 7:
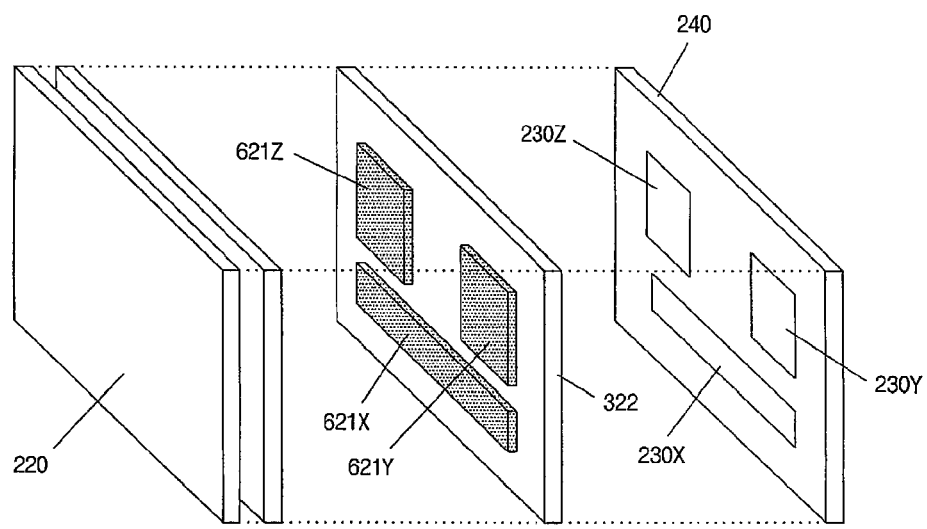
FIG. 7 is a dismantled perspective view illustrating the structure of a plasma display apparatus according to a fifth embodiment of the present invention.

FIG. 7 is a dismantled perspective view illustrating the structure of a plasma display apparatus according to a fifth embodiment of the present invention.

As shown in FIG. 7, the plasma display apparatus according to a fifth embodiment of the present invention comprises a plasma display panel 220 in which an upper and lower substrates are combined and on which images are displayed by a gas discharge, a vibration damping sheet 621X, 621Y and 621Z formed on a rear surface of the plasma display panel 220 in such a way to be opposite to at least one or more of a plurality of driving circuit substrates 230X, 230Y and 230Z, for precluding noise generating from discharge cells within the plasma display panel 220 and driving circuit elements when the plasma display panel 220 is driving for a discharge, a heatproof sheet 322 formed on a rear surface of the vibration damping sheet 621X, 621Y and 621Z, for precluding heat generating from the discharge cells within the plasma display panel 220 and the plurality of driving circuit elements when the plasma display panel 220 is driving for a discharge, a frame 240 formed on a rear surface of the heatproof sheet 322, for fixing a plurality of driving circuit substrates 230X, 230Y and 230Z that drive the plasma display panel 220, and the plurality of driving circuit substrates 230X, 230Y and 230Z fixed to a rear surface of the frame 240, for driving the plasma display panel 220.

The plasma display apparatus constructed above inevitably generates heat and noise when a discharge is generated in the discharge cells within the plasma display panel 220. Heat and noise are also inevitably generated even in various elements attached on the plurality of driving circuit substrates 230X, 230Y and 230Z for forming a potential within the discharge cells for the purpose of a discharge of the plasma display panel 220.

As described above, heat and noise radiated from the discharge cells within the plasma display panel 220 and various elements attached on the plurality of driving circuit substrates 230X, 230Y and 230Z are major factors that degrade the quality of the plasma display apparatus.

In the present invention, to prevent such noise from radiating outside the plasma display apparatus, the vibration damping sheet 621X, 621Y and 621Z are formed between the plasma display panel 220 and the heatproof sheet 322, as shown in FIG. 7.

If the vibration damping sheet 621X, 621Y and 621Z are attached so that they are brought in contact with the plasma display panel 220 and the heatproof sheet 322 as described above, the transfer of vibration occurring when the plasma display panel 220 is discharged and vibration occurring when a voltage is applied to the driving elements in order to drive the plasma display panel 220 can be prevented. It is thus possible to preclude noise from radiating to the outside.

At this time, the vibration damping sheet 621X, 621Y and 621Z can preferably comprise at least one of a polymer-based material and a fiber type inorganic material. More preferably, if the vibration damping sheet 321 comprises both the polymer-based material and the fiber type inorganic material, the transfer of vibration, which is a main cause of noise, can be precluded using frication between polymer and fiber. Therefore, noise can be attenuated within the vibration damping sheet 621X, 621Y and 621Z and then disappear.

Furthermore, the vibration damping sheet 621X, 621Y and 621Z can preferably comprise a thermal conductive material. More preferably, the thermal conductive material can be formed of carbon (C). Therefore, the thermal conductive material performs a heat dissipation function along with a heatproof sheet 322, so that the heat dissipation function of the plasma display apparatus can be doubled.

Figure 8:
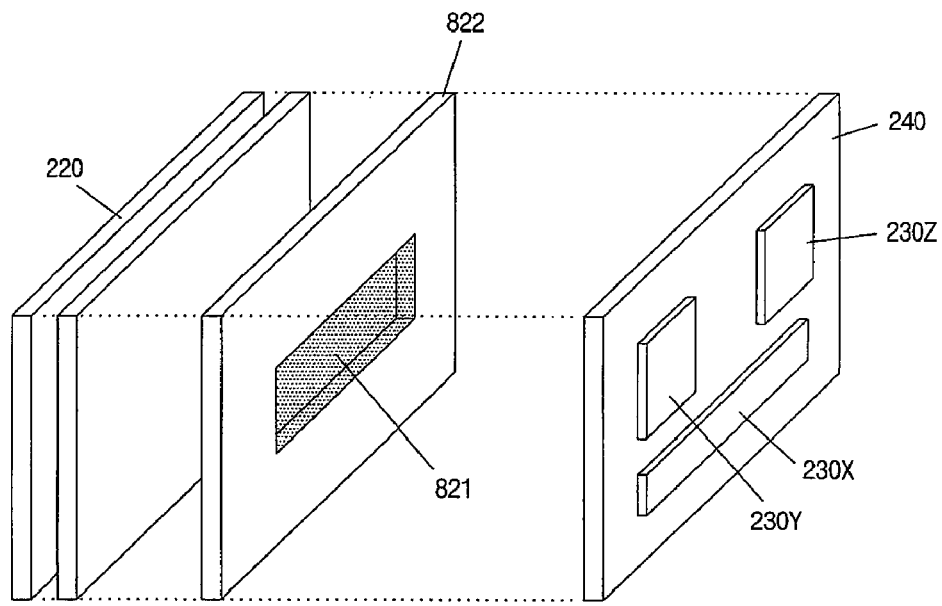
FIG. 8 is a dismantled perspective view illustrating the structure of a plasma display apparatus according to a sixth embodiment of the present invention.

FIG. 8 is a dismantled perspective view illustrating the structure of a plasma display apparatus according to a sixth embodiment of the present invention.

As shown in FIG. 8, the plasma display apparatus according to a sixth embodiment of the present invention comprises a plasma display panel 220 in which an upper and lower substrates are combined and on which images are displayed by a gas discharge, a heatproof sheet 822 formed on a rear surface of the plasma display panel 220, for precluding heat generating from discharge cells within the plasma display panel 220 and driving circuit elements when the plasma display panel 220 is driving for a discharge, a vibration damping sheet 821 formed within a groove having a predetermined width at the rear side of the plasma display panel 220, for precluding noise occurring from discharge cells within the plasma display panel 220 and driving circuit elements when the plasma display panel 220 is driving for a discharge, a frame 240 formed on a rear surface of the vibration damping sheet 821, for fixing a plurality of driving circuit substrates 230X, 230Y and 230Z that drive the plasma display panel 220, and the plurality of driving circuit substrates 230X, 230Y and 230Z fixed to a rear surface of the frame 240, for driving the plasma display panel 220.

The plasma display apparatus constructed above inevitably generates heat and noise when a discharge is generated in the discharge cells within the plasma display panel 220. Heat and noise are also inevitably generated even in various elements attached on the plurality of driving circuit substrates 230X, 230Y and 230Z for forming a potential within the discharge cells for the purpose of a discharge of the plasma display panel 220.

As described above, heat and noise radiated from the discharge cells within the plasma display panel 220 and various elements attached on the plurality of driving circuit substrates 230X, 230Y and 230Z are major factors that degrade the quality of the plasma display apparatus.

In the present invention, to prevent such noise from radiating outside the plasma display apparatus, the vibration damping sheet 821 is disposed between the heatproof sheet 822 and the frame 240 in which the plurality of driving circuit substrates 230X, 230Y and 230Z are mounted, as shown in FIG. 8.

If the vibration damping sheet 821 is brought in contact with the heatproof sheet 822 and the frame 240 in which the plurality of driving circuit substrates 230X, 230Y and 230Z are mounted as described above, the transfer of vibration occurring when the plasma display panel 220 is discharged and vibration occurring when a voltage is applied to the driving elements in order to drive the plasma display panel 220 can be prevented. It is thus possible to preclude noise from radiating to the outside.

At this time, the vibration damping sheet 821 can preferably comprise at least one of a polymer-based material and a fiber type inorganic material. More preferably, if the vibration damping sheet 821 comprises both the polymer-based material and the fiber type inorganic material, the transfer of vibration, which is a main cause of noise, can be precluded using frication between polymer and fiber. Therefore, noise can be attenuated within the vibration damping sheet 821 and then disappear.

Furthermore, the vibration damping sheet 821 can preferably comprise a thermal conductive material. More preferably, the thermal conductive material can be formed of carbon (C). Therefore, the thermal conductive material performs a heat dissipation function along with a heatproof sheet 822, so that the heat dissipation function of the plasma display apparatus can be doubled.

Figure 9:
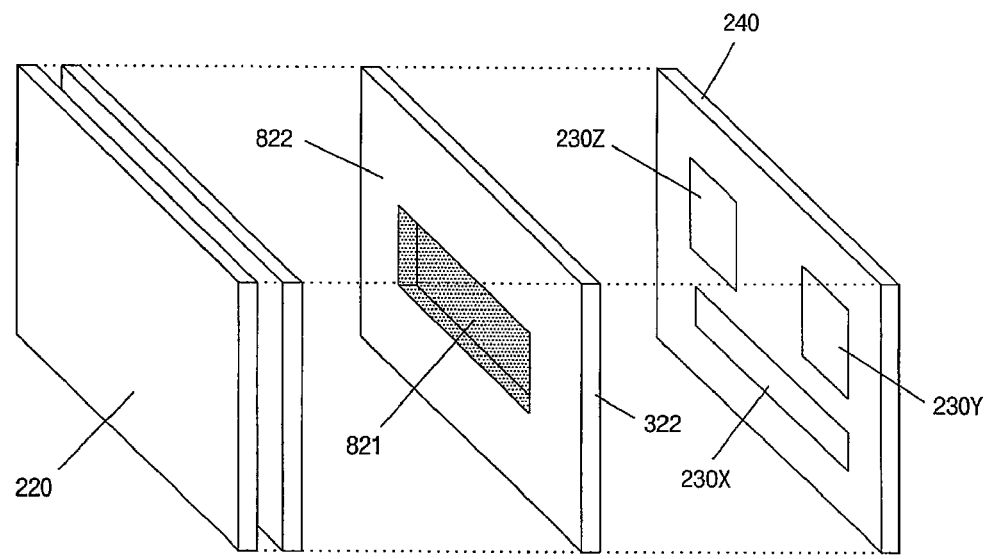
FIG. 9 is a dismantled perspective view illustrating the structure of a plasma display apparatus according to a seventh embodiment of the present invention.

FIG. 9 is a dismantled perspective view illustrating the structure of a plasma display apparatus according to a seventh embodiment of the present invention.

As shown in FIG. 9, the plasma display apparatus according to a seventh embodiment of the present invention comprises a plasma display panel 220 in which an upper and lower substrates are combined and on which images are displayed by a gas discharge, a vibration damping sheet 821, which is adhered to a rear surface of the plasma display panel 220 and is formed within a groove having a predetermined width at the front side of a heatproof sheet 822, for precluding noise occurring from discharge cells within the plasma display panel 220 and driving circuit elements when the plasma display panel 220 is driving for a discharge, a heatproof sheet 822 formed on a rear surface of the vibration damping sheet

821, for precluding heat generating from the discharge cells within the plasma display panel 220 and the plurality of driving circuit elements when the plasma display panel 220 is driving for a discharge, a frame 240 formed on a rear surface of the heatproof sheet, for fixing a plurality of driving circuit substrates 230X, 230Y and 230Z that drive the plasma display panel 220, and the plurality of driving circuit substrates 230X, 230Y and 230Z fixed to a rear surface of the frame 240, for driving the plasma display panel 220

The plasma display apparatus constructed above inevitably generates heat and noise when a discharge is generated in the discharge cells within the plasma display panel 220. Heat and noise are also inevitably generated even in various elements attached on the plurality of driving circuit substrates 230X, 230Y and 230Z for forming a potential within the discharge cells for the purpose of a discharge of the plasma display panel 220.

As described above, heat and noise radiated from the discharge cells within the plasma display panel 220 and various elements attached on the plurality of driving circuit substrates 230X, 230Y and 230Z are major factors that degrade the quality of the plasma display apparatus.

In the present invention, to prevent such noise from radiating outside the plasma display apparatus, the vibration damping sheet 821 is disposed between the plasma display panel 220 and the heatproof sheet 822, as shown in FIG. 9.

If the vibration damping sheet 821 is brought in contact with the plasma display panel 220 and the heatproof sheet 822 as described above, the transfer of vibration occurring when the plasma display panel 220 is discharged and vibration occurring when a voltage is applied to the driving elements in order to drive the plasma display panel 220 can be prevented. It is thus possible to preclude noise from radiating to the outside.

At this time, the vibration damping sheet 821 can preferably comprise at least one of a polymer-based material and a fiber type inorganic material. More preferably, if the vibration damping sheet 821 comprises both the polymer-based material and the fiber type inorganic material, the transfer of vibration, which is a main cause of noise, can be precluded using frication between polymer and fiber. Therefore, noise can be attenuated within the vibration damping sheet 821 and then disappear.

Furthermore, the vibration damping sheet 821 can preferably comprise a thermal conductive material. More preferably, the thermal conductive material can be formed of carbon (C). Therefore, the thermal conductive material performs a heat dissipation function along with a heatproof sheet 822, so that the heat dissipation function of the plasma display apparatus can be doubled.

As described above, noise occurring in a discharge of a plasma display panel and driving circuit elements is precluded. Therefore, the present invention is advantageous in that it can guarantee a high level of noise reduction and can save the manufacturing cost of a plasma display apparatus.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A plasma display apparatus comprising:
   a plasma display panel in which upper and lower substrates are combined;
   a heatproof sheet formed on a rear surface of the plasma display panel;
   a vibration damping sheet formed on a rear surface of the heatproof sheet; and
   a plurality of driving circuit substrates formed on a rear surface of the vibration damping sheet, for driving the plasma display panel,
   wherein a groove is formed in the rear surface of the heatproof sheet, and the vibration damping sheet is formed in the groove.

2. The plasma display apparatus as claimed in claim 1, further comprising a frame formed on the rear surface of the vibration damping sheet, for fixing the plurality of driving circuit substrates.

3. The plasma display apparatus as claimed in claim 2, wherein the vibration damping sheet is attached opposite to at least one or more of the plurality of driving circuit substrates.

4. The plasma display apparatus as claimed in claim 3, wherein the vibration damping sheet comprises at least one of a polymer-based material and a fiber type inorganic material.

5. The plasma display apparatus as claimed in claim 4, wherein the vibration damping sheet comprises a thermal conductive material, and the thermal conductive material is carbon (C).

6. The plasma display apparatus as claimed in claim 1, wherein the vibration damping sheet comprises at least one of a polymer-based material and a fiber type inorganic material.

7. The plasma display apparatus as claimed in claim 6, wherein the vibration damping sheet comprises a thermal conductive material, and the thermal conductive material is carbon (C).

8. A plasma display apparatus comprising:
   a plasma display panel in which upper and lower substrates are combined;
   a vibration damping sheet formed on a rear surface of the plasma display panel;
   a heatproof sheet formed on a rear surface of the vibration damping sheet; and
   a plurality of driving circuit substrates formed on a rear surface of the heatproof sheet, for driving the plasma display panel,
   wherein a groove is formed in a rear surface of the heatproof sheet, and the vibration damping sheet is formed in the groove.

9. The plasma display apparatus as claimed in claim 8, further comprising a frame formed on the rear surface of the heatproof sheet, for fixing the plurality of driving circuit substrates.

10. The plasma display apparatus as claimed in claim 9, wherein the vibration damping sheet is attached opposite to at least one or more of the plurality of driving circuit substrates.

11. The plasma display apparatus as claimed in claim 10, wherein the vibration damping sheet comprises at least one of a polymer-based material and a fiber type inorganic material.

12. The plasma display apparatus as claimed in claim 11, wherein the vibration damping sheet comprises a thermal conductive material, and the thermal conductive material is carbon (C).

13. The plasma display apparatus as claimed in claim 8, wherein the vibration damping sheet comprises at least one of a polymer-based material and a fiber type inorganic material, the vibration damping sheet comprises a thermal conductive material, and the thermal conductive material is carbon (C).

* * * * *